United States Patent
Kepler et al.

(10) Patent No.: US 6,599,810 B1
(45) Date of Patent: Jul. 29, 2003

(54) SHALLOW TRENCH ISOLATION FORMATION WITH ION IMPLANTATION

(75) Inventors: Nick Kepler, Saratoga, CA (US); Olov Karlsson, San Jose, CA (US); Larry Wang, San Jose, CA (US); Basab Bandyopadhyay, Austin, TX (US); Effiong Ibok, Sunnyvale, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/186,078

(22) Filed: Nov. 5, 1998

(51) Int. Cl.⁷ ............................................. H01L 21/76
(52) U.S. Cl. ...................... 438/424; 438/524; 438/528
(58) Field of Search ................................ 438/224, 243, 438/424, 433, 434, 524, 528

(56) References Cited

U.S. PATENT DOCUMENTS 5,874,346 A * 2/1999 Fulford, Jr. et al. ........ 438/433
5,891,787 A * 4/1999 Gardner et al. ............. 438/424
5,904,538 A * 5/1999 Son et al. .................... 438/424
5,904,541 A * 5/1999 Rho et al. .................... 438/433
5,930,620 A * 7/1999 Writers et al. .............. 438/243
5,960,276 A * 9/1999 Liaw et al. .................. 438/224

OTHER PUBLICATIONS

Wolf et al. "Silicon Processing for the VLSI Era" vol. 1, Lattice Press, 1986, p. 212.*

* cited by examiner

*Primary Examiner*—Wael Fahmy
*Assistant Examiner*—Anh Duy Mai

(57) ABSTRACT

An insulated trench isolation structure is formed by ion implanting impurities proximate to the trench edges for enhancing the oxidation rate and, hence, increasing the thickness of the oxide at the trench edges. Embodiments include ion implanting impurities prior to growing an oxide liner. The resulting thick oxide on the trench edges avoids overlap of a subsequently deposited polysilicon layer and breakdown problems attendant upon a thinned gate oxide at the trench edges.

21 Claims, 6 Drawing Sheets

Figure 4C

SHALLOW TRENCH ISOLATION FORMATION WITH ION IMPLANTATION

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor. The quality and thickness of the gate oxide are crucial to the performance of the finished device.

A typical method of trench formation comprises initially growing a pad oxide layer on the substrate, and depositing a barrier nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then refilled with an insulating material (or "trench fill"), such as silicon dioxide derived from tetraethyl orthosilicate (TEOS). The surface is then planarized, as by chemical-mechanical polishing (CMP) using the barrier nitride layer as a polish stop. In subsequent operations, the nitride and pad oxide are stripped off, a thin gate oxide layer is grown on the exposed silicon of the substrate, and a polysilicon layer is deposited on the gate oxide and etched to form gate electrodes.

Figure 1:
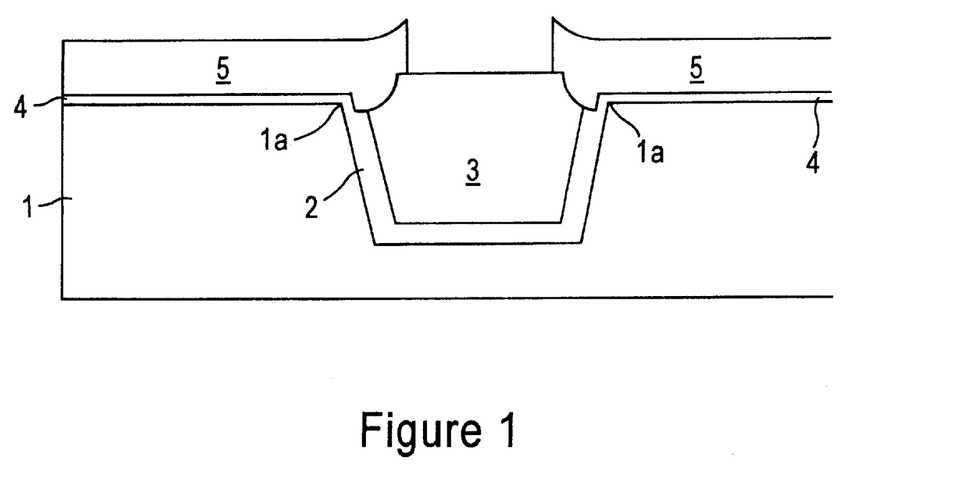
FIG. 1 schematically illustrates an STI structure with undesirably thinned gate oxide at the trench edges.

Disadvantageously, the gate oxide layer typically does not grow uniformly. It tends to be thinner at the trench edges, because the gate oxide growth rate is smaller there due to the curvature of the trench edges; that is, the gate oxide grows at a decreased rate at the trench edges because the silicon at the trench edges has a different crystallographic orientation than the main surface of the substrate. The thinness of the gate oxide at the trench edges allows the subsequently deposited polysilicon to overlap the trench edges. This is shown in FIG. 1, illustrating the substrate 1, trench edges 1a, liner oxide 2, insulating material 3, gate oxide 4 and polysilicon 5. The overlap of polysilicon increases the chance of polysilicon remaining in the trench after it is etched to form the gates. This residual polysilicon, along with the thin gate oxide at the trench edges, increases the electric field strength at the trench edges, which can cause a breakdown of the gate oxide, thereby decreasing device reliability.

There exists a continuing need for shallow trench isolation methodology wherein the resulting gate oxide layer at the trench edges exhibits high reliability and prevents the polysilicon layer from overlapping the trench edges.

SUMMARY OF THE INVENTION

An object of the present invention is a method of manufacturing a semiconductor device having a shallow trench isolation region and a gate oxide with high integrity.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; forming a barrier nitride layer having an upper surface on the pad oxide layer; providing a mask having an opening on the barrier nitride layer; etching to remove portions of the underlying barrier nitride and pad oxide layers and to form a trench in the substrate or epitaxial layer, which trench has a surface layer comprising side surfaces intersecting the main surface at edges; ion implanting impurities, at an acute angle, into a portion of the side surfaces and a portion of the main surface proximal to the edges for increasing the oxidation rate of the ion implanted portions; forming an oxide liner on the surface layer of the trench, on the edges, and in contact with the pad oxide layer, the oxide liner having a thickness at the edges on the ion implanted portions greater than that of the remainder of the oxide liner; removing the barrier nitride layer and pad oxide layer; and forming a gate oxide layer on the main surface in contact with the oxide liner, the gate oxide layer having a thickness proximal to the edges greater than or equal to that of the remainder of the gate oxide layer.

Another aspect of the present invention is a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; forming a barrier nitride layer having an upper surface on the pad oxide layer; providing a mask having an opening on the barrier nitride layer; etching to remove portions of the underlying barrier nitride and pad oxide layers and to form a trench in the substrate or epitaxial layer, which trench comprises side surfaces intersecting the main surface at edges; forming an oxide layer lining the surface layer of the trench, on the edges, and in contact with the pad oxide layer; ion implanting impurities at an acute angle through the oxide liner and into a portion of the side surfaces and a portion of the main surface proximal to the edges, thereby increasing the oxidation rate of the ion implanted portions; depositing an insulating material to fill the trench and cover the barrier nitride layer; planarizing such that an upper surface of the insulating material is substantially flush with the upper surface of the barrier nitride layer; removing the barrier nitride layer and the pad oxide layer; and growing a gate oxide layer on the main surface and on the edges, the gate oxide layer having a thickness at the edges which is greater than that of the remainder of the gate oxide layer.

A still further aspect of the present invention is a semiconductor device comprising: a substrate or epitaxial layer formed in the substrate; a trench, formed in the substrate or epitaxial layer, having a surface layer comprising side surfaces intersecting a main surface of the substrate or epitaxial layer at edges, wherein a portion of the side surface and a portion of the main surface proximal to the edges contain impurities; a thermally grown oxide liner on the surface layer of the trench and on the edges, the liner having a thickness proximal to the edges greater than a thickness of the liner at the remainder of the surface layer; an insulating material filling the trench; and a gate oxide layer on the main surface in contact with the oxide liner, the gate oxide layer having a thickness proximal to the edges greater than or equal to a thickness of the gate oxide layer at the remainder of the main surface.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention addresses and solves problems stemming from a characteristic reduction in the thickness of a gate oxide at the trench edges attendant upon conventional STI methodology. As a result of gate oxide thinning at the trench edges, the quality of the thinned gate oxide decreases with an attendant increase in the electric field strength at the trench edges, leading to early breakdown of the gate oxide, thereby decreasing the lifetime of the semiconductor device.

The present invention addresses and solves such problems by enabling the manufacture of a semiconductor device having a desirably thick gate oxide at the trench edges.

According to the methodology of an embodiment of the present invention, a photoresist mask is formed on a barrier nitride layer which, in turn, is formed on a pad oxide layer on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate.

After masking, the substrate is etched to form a trench having side surfaces intersecting the substrate surface at edges. Impurities, such as boron, arsenic, silicon or phosphorus ions, are then implanted, as by ion implantation at an acute angle, into portions of the side surfaces and the main surface near the trench edges for increasing the oxidation rate of the impurity implanted portions. An oxide liner is then grown in the trench surface and on the edges in contact with the pad oxide. Due to the strategic implantation of impurities increasing the oxidation rate, the oxide liner grows much thicker near the trench edges than on the rest of the trench surface.

The trench is thereafter refilled with an insulating material, and the insulating material planarized, as by CMP. Subsequently, the pad oxide and barrier nitride layers are removed and a gate oxide layer is grown on the main surface of the substrate in contact with the thick oxide liner on the trench edges, followed by deposition of a polysilicon layer. Due to the strategic implantation of impurities into portions of the main surface, the gate oxide grows at least as thick near the trench edges as on the rest of the main surface.

Thus, the inventive methodology advantageously provides a thick oxide liner and gate oxide on the trench edges. As a result, the gate oxide will not be thinned at the edges, thereby avoiding the polysilicon overlap and breakdown problems of conventional STI formation techniques attendant upon a reduction in gate oxide thickness at the edges.

In another embodiment of the present invention, impurities are implanted proximal to the trench edges following the formation of the oxide liner. In this way, implanted impurities are not lost from the substrate during formation of the oxide liner, thereby ensuring a greater oxidation rate enhancement during gate oxidation, resulting in a thicker gate oxide at the edges.

Figure 2A:
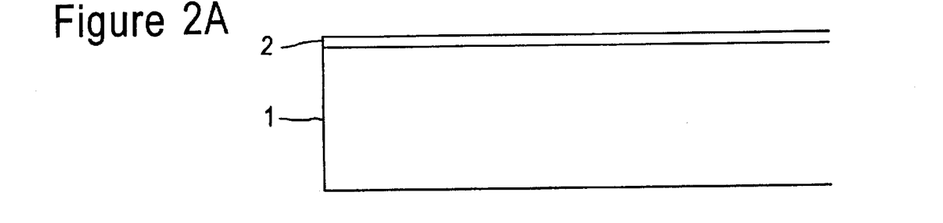
FIGS. 2A–2I schematically illustrate sequential phases of a method in accordance with a first embodiment of the present invention.

An embodiment of the present invention is illustrated in FIGS. 2A–2I, wherein sequential phases in forming a semiconductor device in accordance with the present invention are shown. Referring to FIG. 2A, a substrate 1 is prepared having a substantially planar surface, typically a semiconductor substrate comprising doped monocrystalline silicon or an epitaxial layer formed on a semiconductor substrate in accordance with conventional practices. A pad oxide layer 2 is then grown on the substrate 1. Pad oxide layer 2 typically comprises silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer.

Figure 2B:
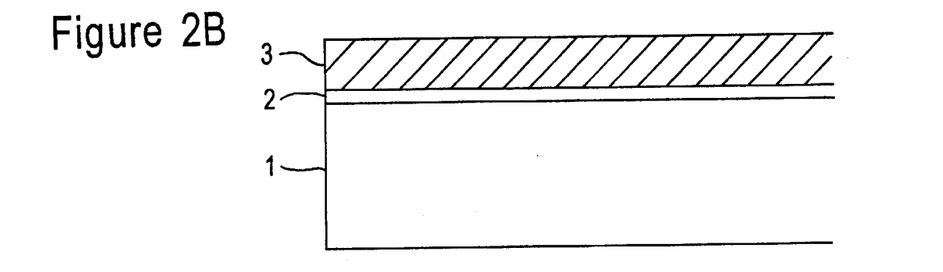

After formation of the pad oxide layer 2, a barrier nitride layer 3 is deposited on the pad oxide layer 2, as shown in FIG. 2B, such as a silicon nitride layer by CVD. Silicon oxide pad layer 2 functions as a buffer layer cushioning stresses between substrate 1 and barrier nitride layer 3. Barrier nitride layer 3 functions as an oxidation mask as it is resistant to the diffusion of oxygen and water vapor therethrough, thereby preventing an oxidizing species from reaching the underlying silicon substrate, and also acts as a polish stop.

Figure 2C:
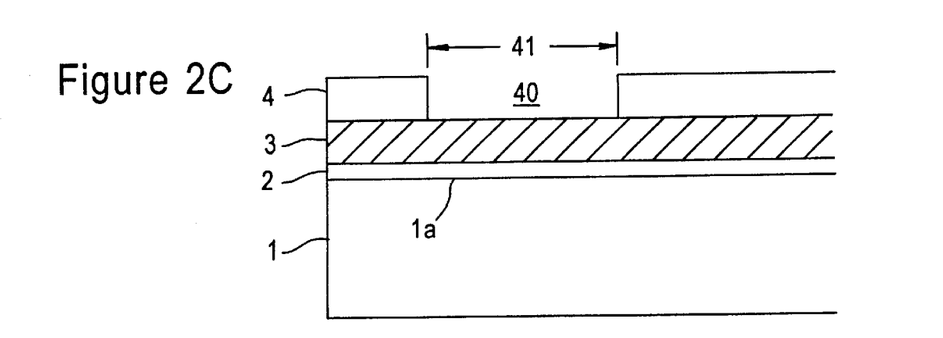
Figure 2D:
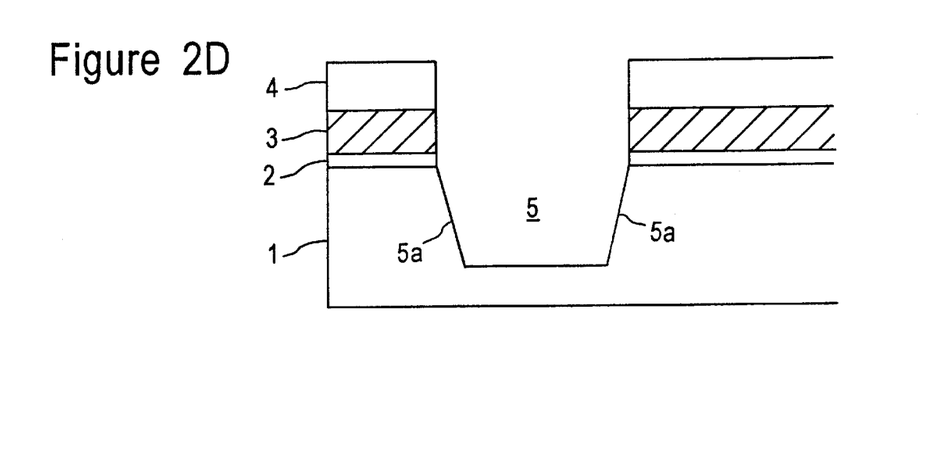

A photoresist mask 4 is then formed on barrier nitride layer 3, as shown in FIG. 2C. Photoresist mask 4 has a pattern defined by openings 40, which have a width 41 substantially corresponding to the width of the subsequently formed trench at the main surface 1a of the substrate 1, such as about 0.25µ or less. The barrier nitride layer 3 is then etched away, and the etching continues through the pad oxide layer 2 and into the substrate 1 to form the shallow trench 5 having side surfaces 5a, as shown in FIG. 2D. The trench 5 is typically etched to a depth of up to about 4000 Å. In practicing the present invention, a trench depth of about 2500 Å to about 3000 Å has been found particularly suitable. When the etching of the trench 5 is completed, the photoresist 4 is stripped off the barrier nitride layer 3.

Figure 2E:
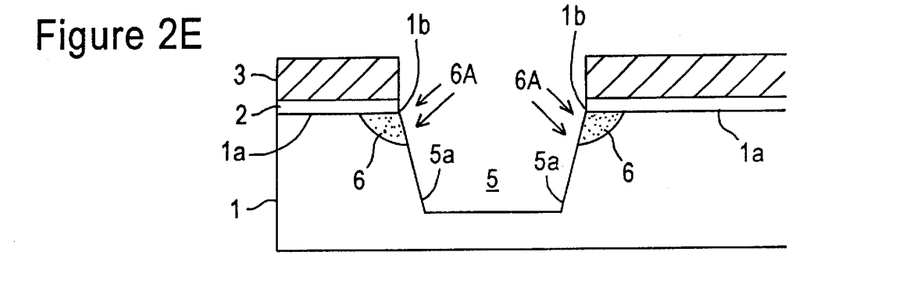

Thereafter, as depicted in FIG. 2E, impurities 6 are implanted at an acute angle, indicated by arrows 6A, into portions of side surfaces 5a and a portion of the main surface 1a of the substrate 1 near the trench edges 1b. Suitable impurities 6 include any impurities that enhance the oxidation rate of the ion implanted silicon substrate 1, such as boron, arsenic, silicon or phosphorus. N-type impurities are preferred, because they enhance the oxidation rate of the substrate 1 to a greater degree than p-type impurities. Embodiments of the present invention include ion implanting n-type impurities into n-type impurity regions of substrate 1, and ion implanting p-type impurities into p-type impurity regions of substrate 1. Ion implantation is typically conducted at an energy of about 40 keV or less, and at a dosage of up to about $10^{15}$ atoms $cm^{-2}$.

Impurities 6 are typically implanted at an acute angle of about 10° to about 60°, e.g., an angle of about 45°. Ion implanting impurities at an acute angle avoids doping the side surfaces 5a of trench 5 remote from the edges 1b, thereby increasing the oxidation rate of such implanted side surfaces 5a, causing undesirable "reentrance" of the side surfaces 5a. The side surfaces 5a typically have a slope of about 70° to about 75° from the horizontal. However, if their oxidation rate is enhanced relative to an adjacent active region of substrate 1, the side surfaces 5a will expand inwardly and tend to vertically align during the subsequent liner oxidation step, thereby inducing stress in the active region. This condition is called reentrance, and the resulting stress in the active region degrades the quality of the subsequently grown gate oxide, adversely affecting the performance of the finished device.

Figure 2F:
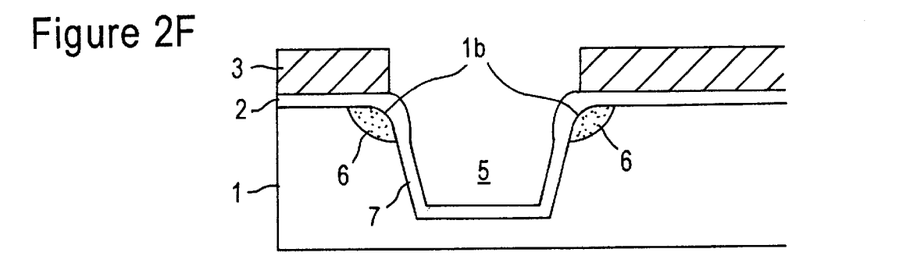
Figure 2G:
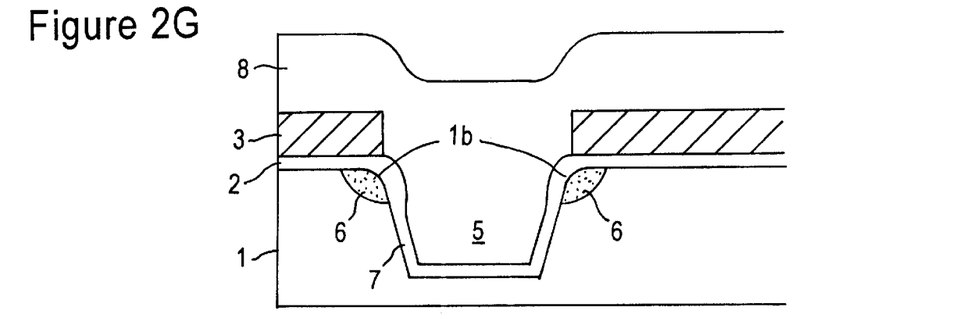
Figure 2H:
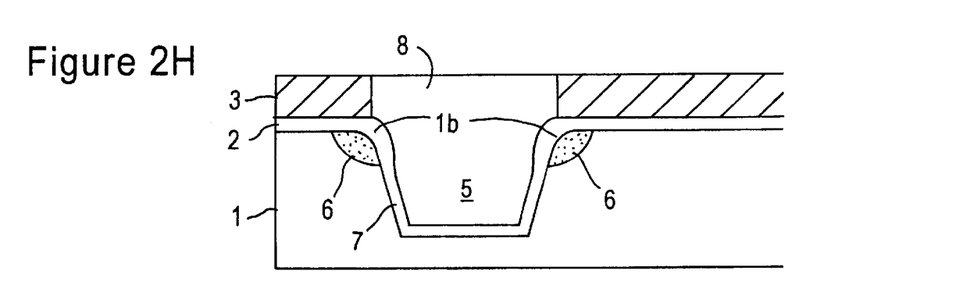

Following ion implantation, the trench surface is thermally oxidized, typically at a temperature of about 850° C. to about 1100° C., to form a silicon oxide liner 7 on the inner surface of trench 5, on the edges 1b, and in contact with the pad oxide layer 2. Due to the presence of impurities 6, which increase the oxidation rate of the implanted portions of substrate 1 near the edges 1b, the silicon oxide liner 7 has a thickness about 500 Å to about 800 Å greater proximal to the edges 1b than at the remainder of the inner surface of the trench 5. FIG. 2F shows the trench 5 with the completed liner 7. Subsequent to formation of silicon oxide liner 7, trench 5 is filled with a suitable insulating material 8, as shown in FIG. 2G. Such insulating material can comprise silicon dioxide derived from TEOS by LPCVD or derived from silane by LPCVD. The trench 5 can also be filled with a high density plasma (HDP) oxide, preferably employing the methodology disclosed in copending application Ser. No. 08/924,133, filed Sep. 5, 1997, the entire disclosure of which is hereby incorporated herein by reference. Subsequent to trench filling, planarization is effected, such as by CMP, as shown in FIG. 2H, to complete the STI structure.

Figure 2I:
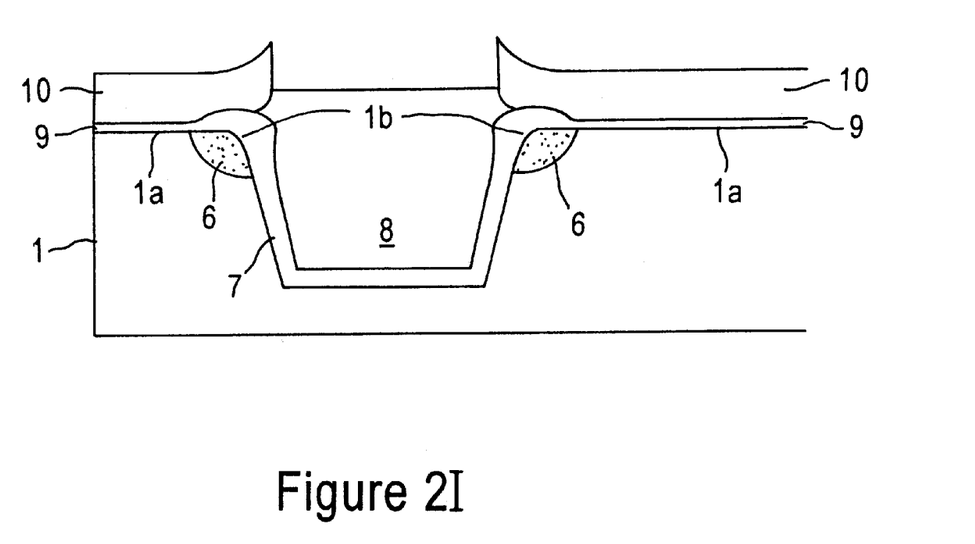

Thereafter, barrier nitride layer 3 and pad oxide layer 2 are removed, and gate oxide layer 9 is grown on the main surface 1a of substrate 1 in contact with oxide liner 7, as shown in FIG. 2I. Since the implanted impurities 6 enhance the oxide growth proximal to the edges, the gate oxide layer has a thickness proximal to the edges at least as great as its thickness on the remainder of the main surface 1a.

Gate oxide growth is followed by deposition of polysilicon layer 10. Since the oxide liner 7 and gate oxide layer 8 are relatively thick at the edges 1b, polysilicon 10 does not overlap the edge as shown in FIG. 1, thereby preventing polysilicon from encroaching into the trench after it is etched to form gates and avoiding an undesirable increase in the electric field strength at the trench edges.

Figure 3:
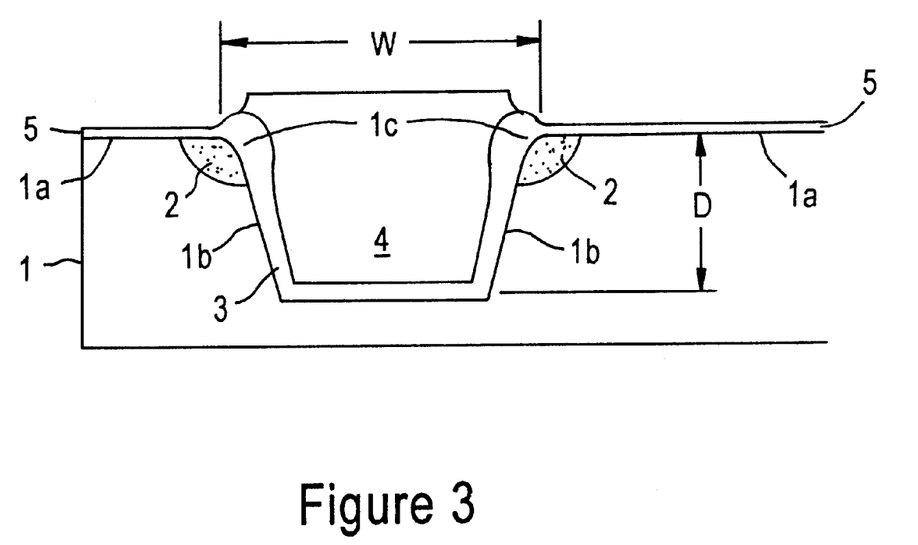
FIG. 3 is a cross-sectional view of a semiconductor device according to the present invention.

An embodiment of a semiconductor device in accordance with the present invention is shown in FIG. 3. The depicted semiconductor device comprises a trench formed in a substrate 1 or in an epitaxial layer formed in substrate 1, the trench having a surface layer comprising side surfaces 1b intersecting the main surface 1a of the substrate 1 at trench edges 1c. The side surfaces 1b and main surface 1a proximal to the edges 1c contain impurities 2, such as boron, arsenic, silicon or phosphorus. A silicon oxide liner 3 is thermally grown on the surface layer of the trench and on the edges 1c and the liner 3, typically having a thickness proximal to the edges 1c about 500 Å to about 800 Å greater than the thickness of the remaining silicon oxide liner 7. A silicon oxide insulating material 4 fills the trench. A gate oxide layer 5 is disposed on the main surface 1a in contact with the liner 3, the gate oxide layer 5 having a thickness proximal to the edges 1c greater than or equal to the thickness of the gate oxide layer 5 at the remainder of the main surface 1a.

The trench opening typically has a width W at the main surface 1a of about 0.25µ or less, and a depth D of up to about 4000 Å; e.g., about 2500 Å to about 3000 Å. The impurities 2 can comprise n-type impurities in an n-type impurity region of substrate 1, and can comprise p-type impurities in a p-type impurity region.

Figure 4A:
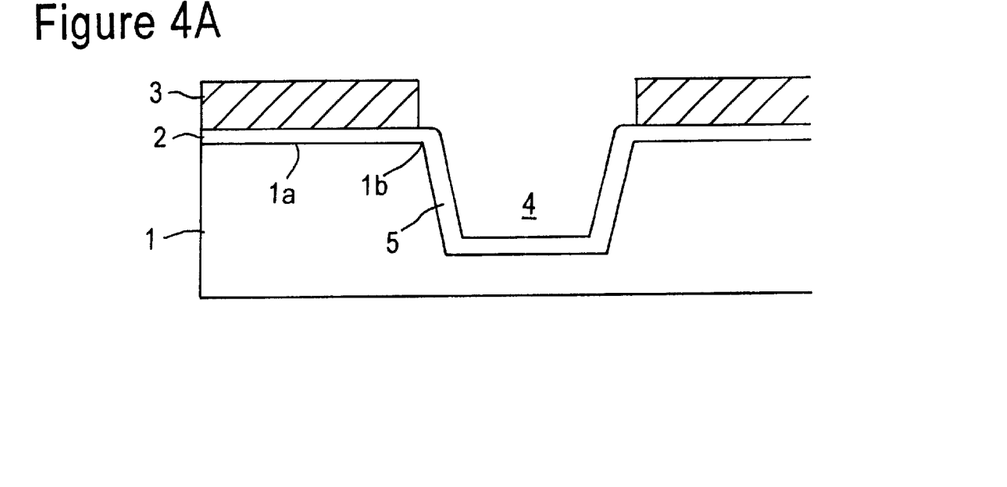
FIGS. 4A–4C schematically illustrate sequential phases of a method in accordance with a second embodiment of the present invention.
Figure 4B:
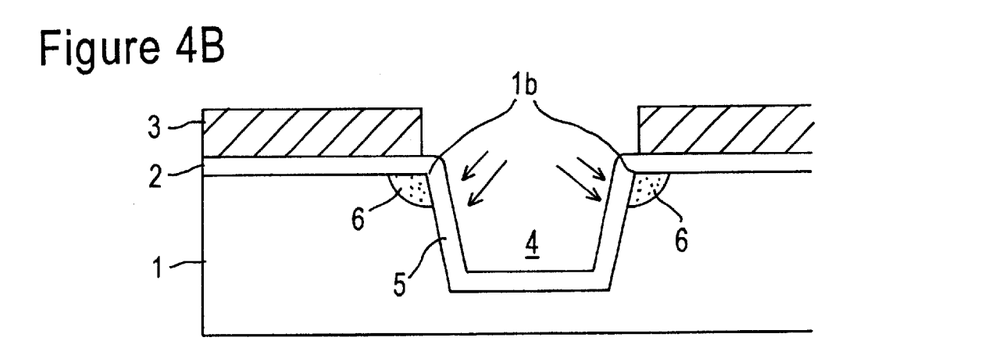
Figure 4C:
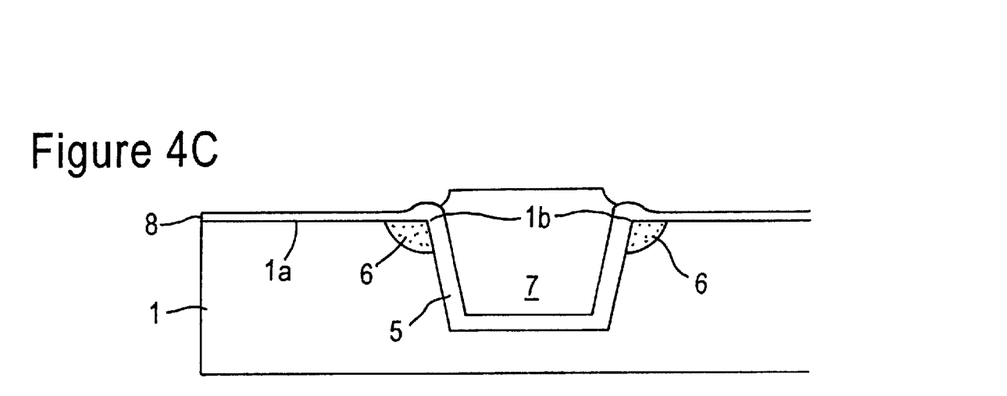

FIGS. 4A–4C depict sequential phases in forming a semiconductor device in accordance with another embodiment of the present invention. Referring to FIG. 4A, a pad oxide layer 2 and barrier nitride layer 3 are formed, then a trench 4 is formed, as in the embodiment depicted in FIGS. 2A–2D. In this embodiment, oxide liner 5 is grown before ion implantation. As shown in FIG. 4B, the impurities 6 are implanted through the oxide liner 5 into the substrate 1 proximal to the trench edges 1b. After filling the trench 4, the insulating material 7 is planarized, the pad oxide 2 and barrier nitride layer 3 are removed, and a gate oxide layer 8 is grown, as depicted in FIG. 4C. Since the impurities 6 increase the oxide growth rate proximal to the edges 1b, resulting gate oxide layer 8 is thicker at the edges 1b than at the remainder of the main surface 1a.

The trench isolation formed in accordance with the present invention is characterized by gate oxide layers at the trench edges which are not thinned, but are relatively thick and exhibit high quality, with an attendant reduction in the overlap of subsequently deposited polysilicon at the trench edge, and a reduction in the electric field between the gate electrode and the substrate at the trench edges. As a result, the present invention advantageously avoids gate oxide breakdown and device failure. The present invention is applicable to the manufacture of various types of semiconductor devices having STI, particularly high density semiconductor devices having a design rule of about 0.25µ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an insulated trench formed in a semiconductor substrate or in an epitaxial layer on the semiconductor substrate, which method comprises:

forming a pad oxide layer on a main surface of the substrate or epitaxial layer;

forming a barrier nitride layer having an upper surface on the pad oxide layer;

providing a mask having an opening on the barrier nitride layer;

etching to remove portions of the underlying barrier nitride and pad oxide layers and to form a trench in the substrate or epitaxial layer, which trench has a surface comprising side surfaces intersecting the main surface at edges;

ion implanting impurities, at an acute angle, into a portion of the side surfaces and a portion of the main surface proximal to the edges for increasing the oxidation rate of the ion implanted portions;

forming an oxide liner on the surface of the trench, on the edges, and in contact with the pad oxide layer, the oxide liner having a thickness at the edges on the ion implanted portions greater than at the remainder of the trench surface;

removing the barrier nitride layer and pad oxide layer; and forming a gate oxide layer on the main surface in contact with the oxide liner, the gate oxide layer having a thickness proximal to the edges greater than or equal to that of the remainder of the gate oxide layer.

2. The method according to claim 1, wherein the pad oxide layer comprises silicon dioxide.

3. The method according to claim 1, wherein the mask comprises a photoresist mask.

4. The method according to claim 1, wherein the width of the opening is about $0.25\mu$ or under.

5. The method according to claim 4, comprising etching the trench to a depth of up to about 4000 Å.

6. The method according to claim 5, comprising etching the trench to a depth of about 2500 Å to about 3000 Å.

7. The method according to claim 1, comprising implanting boron, arsenic, silicon or phosphorus ions.

8. The method according to claim 7, comprising implanting ions at an angle of about 10° to about 60°.

9. The method according to claim 8, comprising implanting ions at an angle of about 45°.

10. The method according to claim 7, comprising implanting ions at an energy of about 40 keV or less.

11. The method according to claim 7, comprising implanting ions at a dosage up to about $10^{15}$ atoms $cm^{-2}$.

12. The method according to claim 7, comprising implanting n-type ions into an n-type region.

13. The method according to claim 7, comprising implanting p-type ions into a p-type region.

14. The method according to claim 2, comprising heating at a temperature of about 850° C. to about 1100° C. to thermally grow a silicon oxide layer lining the trench.

15. The method according to claim 14, wherein the thickness of the silicon oxide liner proximal to the edges is about 500 Å to about 800 Å greater than at the remainder of the trench surface.

16. The method according to claim 1 comprising:

depositing an insulating material to fill the trench and cover the barrier nitride layer after forming the liner; and planarizing such that an upper surface of the insulating material is substantially flush with the upper surface of the barrier nitride layer.

17. The method according to claim 16, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

18. The method according to claim 17, comprising planarizing by chemical-mechanical polishing.

19. The product produced by the method of claim 1.

20. A method of manufacturing an integrated circuit, comprising:

forming a silicon oxide pad layer on a main surface of a substrate or an epitaxial layer formed on the substrate;

forming a silicon nitride barrier layer having an upper surface on the silicon oxide pad layer;

providing a photoresist mask having an opening on the silicon nitride barrier layer;

etching to remove portions of the underlying silicon nitride barrier layer and silicon oxide pad layer and to form a trench in the substrate or epitaxial layer, which trench has a surface comprising side surfaces intersecting the main surface at edges;

ion implanting boron, arsenic, silicon or phosphorus into a portion of the side surface and a portion of the main surface proximal to the edges at an angle of about 10° to about 60°, at an energy of about 40 keV or less and at a dosage of up to about $10^{15}$ atoms $cm^{-2}$;

thermally growing a thin silicon oxide liner on the surface of the trench on the edges and in contact with the silicon oxide pad layer at a temperature of about 850° C. to about 1100° C., wherein the thickness of the silicon oxide liner on the implanted portions proximal to the edges is about 500 Å to about 800 Å greater than at the remainder of the trench surface;

depositing an insulating material to fill the trench and cover the silicon nitride barrier layer, the insulating material comprising silicon dioxide derived from tetraethyl orthosilicate (TEOS) by low pressure chemical vapor deposition (LPCVD), silicon dioxide derived from silane by LPCVD, or a high density plasma oxide;

planarizing by chemical-mechanical polishing such that an upper surface of the insulating material is substantially flush with the upper surface of the barrier nitride layer;

thermally growing a gate oxide layer on the main surface in contact with the silicon oxide liner, the gate oxide layer having a thickness proximal to the edges greater than or equal to that of the remainder of the gate oxide layer; and depositing a polysilicon layer on the gate oxide layer.

21. The product produced by the method of claim 20.

* * * * *